United States Patent
Kususe et al.

(10) Patent No.: US 10,651,336 B2
(45) Date of Patent: May 12, 2020

(54) LIGHT-EMITTING DEVICE

(71) Applicant: NICHIA CORPORATION, Anan-shi, Tokushima (JP)

(72) Inventors: Takeshi Kususe, Tokushima (JP); Satoshi Shichijo, Itano-gun (JP); Kunihito Sugimoto, Anan (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 16/579,422

(22) Filed: Sep. 23, 2019

(65) Prior Publication Data

US 2020/0020824 A1    Jan. 16, 2020

Related U.S. Application Data

(63) Continuation of application No. 16/024,620, filed on Jun. 29, 2018, now Pat. No. 10,461,215.

(30) Foreign Application Priority Data

Jun. 30, 2017    (JP) ................................ 2017-128928

(51) Int. Cl.
*H01L 33/54* (2010.01)
*H01L 33/00* (2010.01)
(Continued)

(52) U.S. Cl.
CPC ........ *H01L 33/0075* (2013.01); *H01L 21/563* (2013.01); *H01L 25/0753* (2013.01);
(Continued)

(58) Field of Classification Search
CPC ......... H01L 21/563; H01L 2021/60232; H01L 23/12; H01L 23/488; H01L 24/11;
(Continued)

(56) References Cited

U.S. PATENT DOCUMENTS 8,759,124 B2 * 6/2014 Miyoshi .............. H01L 25/0753
257/E33.056
9,722,156 B2 * 8/2017 Shichijo .................. H01L 33/60
(Continued)

FOREIGN PATENT DOCUMENTS

JP    H07-123202 A    5/1995
JP    2007-208129 A    8/2007
(Continued)

OTHER PUBLICATIONS

Non-Final Office Action on U.S. Appl. No. 16/024,620 dated May 15, 2019.
Notice of Allowance on U.S. Appl. No. 16/024,620 dated Jun. 24, 2019.
Notice of Allowance on U.S. Appl. No. 16/024,620 dated Aug. 15, 2019.

*Primary Examiner* — Stephen W Smoot
(74) *Attorney, Agent, or Firm* — Foley & Lardner LLP

(57) ABSTRACT

A light-emitting device includes: a mounting base; a plurality of light-emitting elements mounted on or above the mounting base; a plurality of light-transmissive members respectively disposed on upper surfaces of the plurality of light-emitting elements; a plurality of light guide members respectively covering lateral surfaces of the plurality of light-emitting elements; a plurality of antireflective films respectively disposed on upper surfaces of the plurality of the light-transmissive members; and a covering member covering lateral surfaces of the plurality of antireflective films.

10 Claims, 10 Drawing Sheets

(51) Int. Cl.
*H01L 33/32* (2010.01)
*H01L 25/075* (2006.01)
*H01L 33/62* (2010.01)
*H01L 21/56* (2006.01)
*H01L 33/44* (2010.01)
*H01L 33/60* (2010.01)
*H01L 33/40* (2010.01)
*H01L 33/50* (2010.01)
*H01L 33/38* (2010.01)

(52) U.S. Cl.
CPC .............. *H01L 33/32* (2013.01); *H01L 33/44* (2013.01); *H01L 33/54* (2013.01); *H01L 33/60* (2013.01); *H01L 33/62* (2013.01); *H01L 33/382* (2013.01); *H01L 33/405* (2013.01); *H01L 33/505* (2013.01)

(58) Field of Classification Search
CPC ..... H01L 24/13; H01L 24/81; H01L 25/0753; H01L 33/007; H01L 33/0075; H01L 33/32; H01L 33/38; H01L 33/405; H01L 33/44; H01L 33/505; H01L 33/507; H01L 33/54; H01L 33/60; H01L 33/62; H01L 2224/81007; H01L 2224/81191; H01L 2224/81894; H01L 2224/81895
See application file for complete search history.

(56) References Cited

U.S. PATENT DOCUMENTS

| | | |
|---|---|---|
| 10,283,670 B2 | 5/2019 | Hashimoto et al. |
| 2010/0190280 A1 | 7/2010 | Horiuchi |
| 2010/0279437 A1 | 11/2010 | Neff et al. |
| 2013/0026527 A1 | 1/2013 | Ichikawa |
| 2013/0105850 A1 | 5/2013 | Komatsu et al. |
| 2014/0175640 A1 | 6/2014 | Kim et al. |
| 2014/0225143 A1 | 8/2014 | Kususe et al. |
| 2016/0093780 A1* | 3/2016 | Beppu .................... H01L 33/50 257/98 |
| 2018/0182929 A1 | 6/2018 | Ozeki et al. |
| 2018/0277721 A1 | 9/2018 | Bando et al. |

FOREIGN PATENT DOCUMENTS

| | | |
|---|---|---|
| JP | 2010-219324 A | 9/2010 |
| JP | 2012-099544 A | 5/2012 |
| JP | 2014-090052 | 5/2014 |
| JP | 2014-207267 A | 10/2014 |
| JP | 2015-201665 A | 11/2015 |
| JP | 2016-115729 A | 6/2016 |
| WO | WO-2011/126000 A1 | 10/2011 |
| WO | WO-2012/014360 A1 | 2/2012 |

* cited by examiner

Enlarged view of the B part

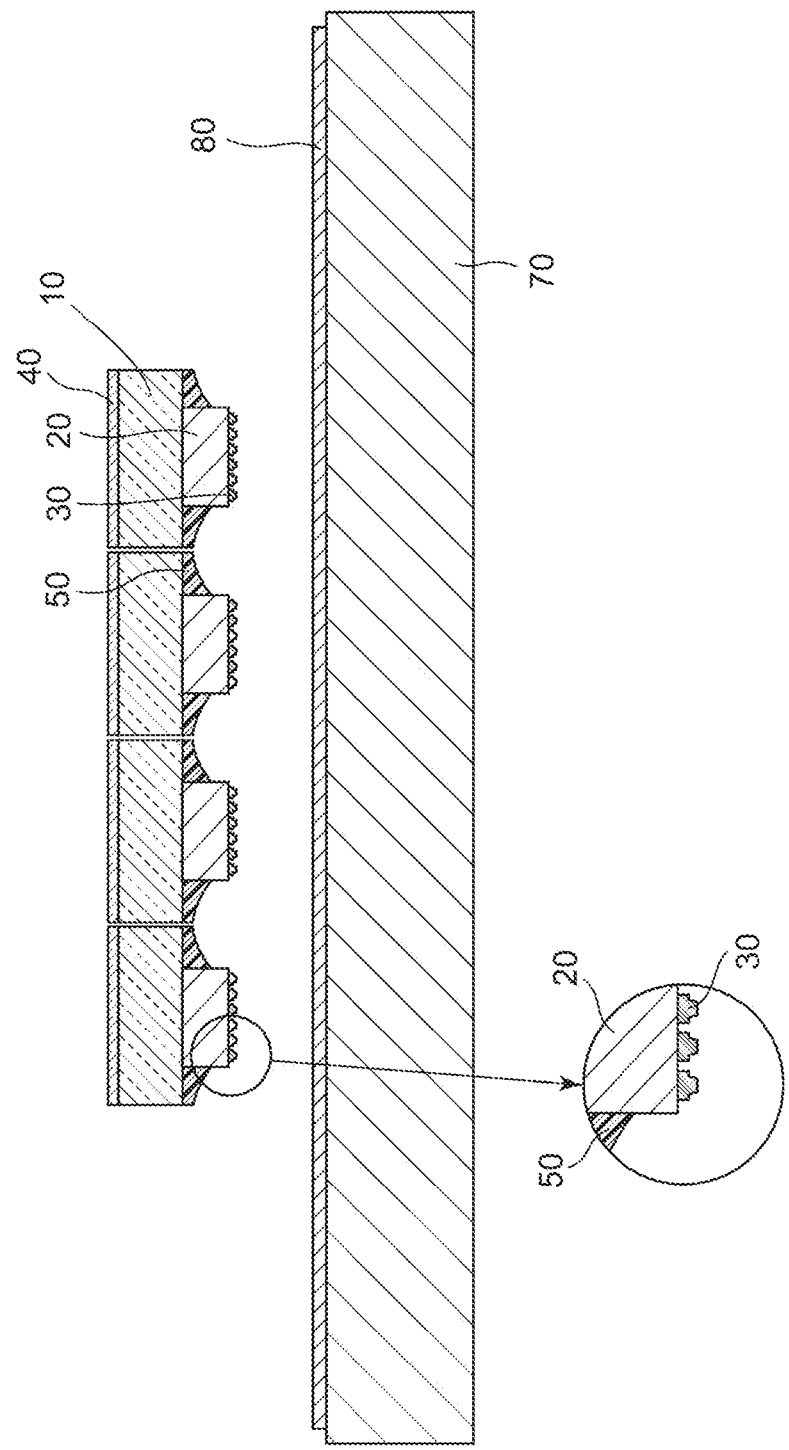

LIGHT-EMITTING DEVICE

CROSS-REFERENCE TO RELATED APPLICATION

This application is a continuation of U.S. patent application Ser. No. 16/024,620, filed Jun. 29, 2018, which claims priority to Japanese Patent Application No. 2017-128928, filed on Jun. 30, 2017, the disclosures of which are hereby incorporated by reference in their entireties.

BACKGROUND

The present disclosure relates to a method of manufacturing a light-emitting device.

There is proposed a method of manufacturing a light-emitting device that includes: a bonding step of bonding a plurality of light-emitting elements directly to a plate-shaped wavelength conversion board converting light emitted from the light-emitting elements into light having a different wavelength; an electrode forming step of forming pad electrodes by compression on the surface of each of the plurality of light-emitting elements bonded to the wavelength conversion board, opposite to the surface bonded to the wavelength conversion board; and a first separation step of cutting the wavelength conversion board into pieces each having at least one of the light-emitting elements (see Japanese Unexamined Patent Application Publication No. 2016-115729).

It is an object of an embodiment of the present disclosure to provide a method of manufacturing a light-emitting device with less mechanical stress on light-emitting elements at the time of mounting the light-emitting elements on or above a mounting base by flip-chip technology.

SUMMARY

Embodiments of the present disclosure are described below.

According to one embodiment, a method of manufacturing a light-emitting device includes: directly bonding a plurality of light-emitting elements to a light-transmissive member having a plate like shape; forming stud bumps on each of a plurality of electrodes on the light-emitting elements after the step of directly bonding; obtaining a plurality of light-transmissive member on each of which one or more of the light-emitting elements are bonded, by dividing the light-transmissive member after the step of forming the stud bumps; and mounting the light-emitting elements on or above a mounting base by flip-chip technique, after the step of obtaining the plurality of light-transmissive members.

According to certain embodiments of the present disclosure, a mechanical stress applied on the light-emitting elements may be reduced at the time of mounting the light-emitting elements on or above the mounting base by flip-chip technology.

BRIEF DESCRIPTION OF THE DRAWINGS

FIG. 5G is a schematic sectional view illustrating the method of manufacturing the light-emitting device 1 according to the first embodiment.

DETAILED DESCRIPTION

Light-Emitting Device 1 According to First Embodiment

Figure 1A:
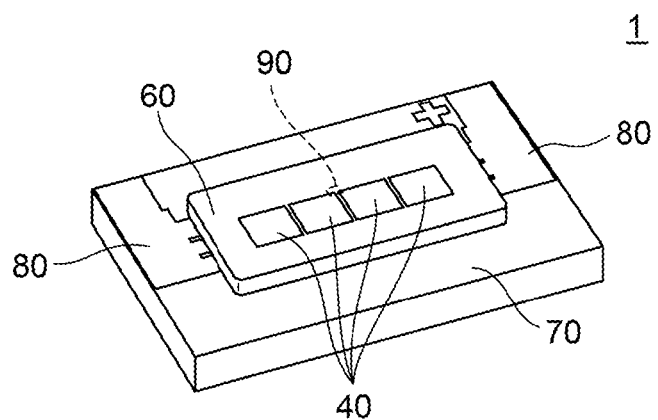
FIG. 1A is a schematic perspective view of a light-emitting device 1 according to a first embodiment.
Figure 1B:
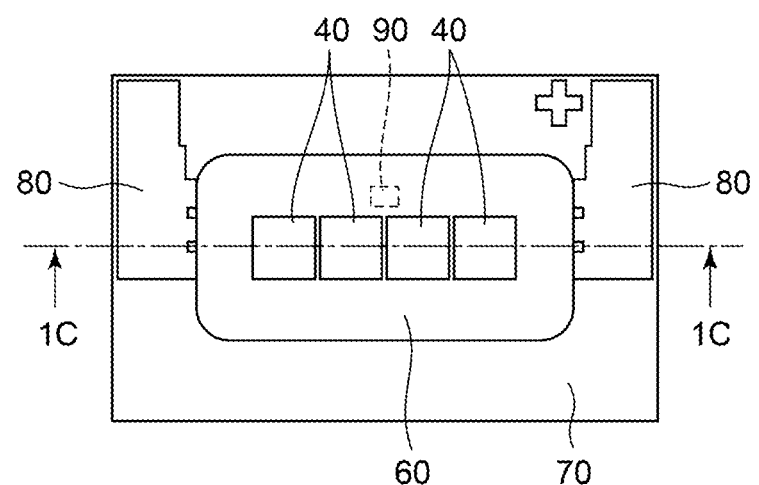
FIG. 1B is a schematic plan view of the light-emitting device 1 according to the first embodiment.
Figure 1C:
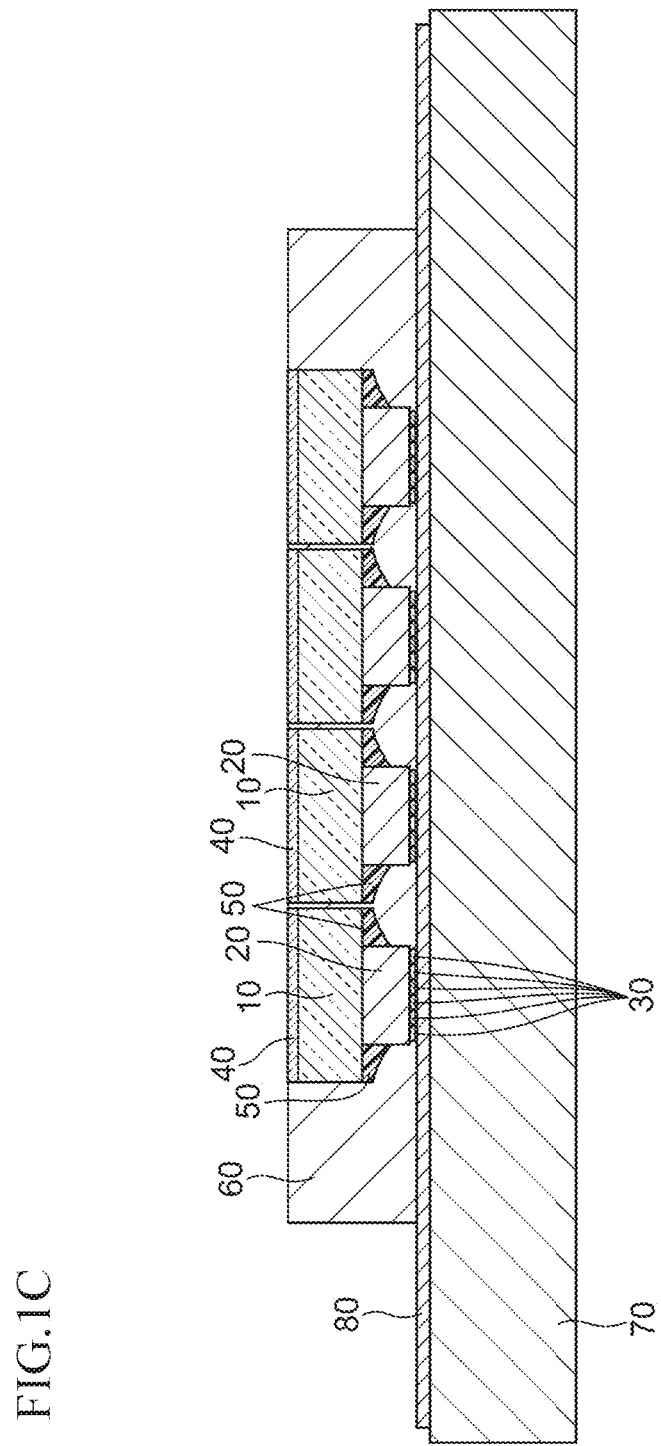
FIG. 1C is a schematic sectional view taken along line 1C-1C in FIG. 1B.

FIG. 1A is a schematic perspective view of a light-emitting device 1 according to a first embodiment. FIG. 1B is a schematic plan view of the light-emitting device 1 according to the first embodiment. FIG. 1C is a schematic sectional view taken along line 1C-1C in FIG. 1B. As illustrated in FIG. 1A to FIG. 1C, the light-emitting device 1 according to the first embodiment includes: a mounting base 70 having a surface on which wirings 80 are formed; a plurality of light-emitting elements 20 mounted on or above the mounting base 70 by flip-chip technique; and a plurality of light-transmissive members 10 respectively disposed on upper surfaces of the plurality of light-emitting elements 20. The light-emitting elements 20 are bonded to the wirings 80 on the mounting base 70 with stud bumps 30. Detailed description will be given below.

Light-Transmissive Member 10

The light-transmissive members 10 are in contact with the upper surfaces of the light-emitting elements 20, and allow light emitted from the light-emitting elements 20 to be transmitted and exit the light-emitting device 1. Each of the light-transmissive members 10 has an upper surface, a lower surface opposed to the upper surface, and lateral surfaces interposed between the upper surface and the lower surface. The upper surface serves as a light-emitting surface of the light-emitting device 1 through which light from the light-emitting element 20 exits the light-emitting device 1. The lower surface is directly bonded to a light-extracting surface of the light-emitting element 20. In a plan view, the light-transmissive member 10 has an area larger than the light-emitting element 20. The light-transmissive member 10 has a thickness (i.e., a height from the upper surface to the lower surface) of, for example, 50 μm to 300 μm.

An exemplary material used for the light-transmissive member 10 include a light-transmissive material (e.g., light-transmissive resin, glass, and ceramic) shaped into a plate, the light-transmissive material having a plate like shape that contains one or more wavelength conversion substances, and sintered bodies of wavelength conversion substances shaped into a plate. Examples of the wavelength conversion substances include oxide-based, sulfide-based, and nitride-based wavelength conversion substances. Specifically, in the case in which a gallium nitride-based light-emitting element that emits blue light is used for the light-emitting element 20, one or a combination of the following wavelength conversion substances may be used: YAG-based and/or LAG-based wavelength conversion substances that absorb blue light and emit yellow to green light; SiAlON-based (e.g., β-SiAlON) and/or SGS wavelength conversion substances that emit green light; and SCASN-based and/or CASN-based wavelength conversion substances that emit red light, manganese-activated potassium fluorosilicate-based wavelength conversion substances (e.g., KSF-based wavelength conversion substance: $K_2SiF_6:Mn$), and sulfide-based wavelength conversion substances. The light-transmissive member 10 may contain, for example, 2 weight % to 50 weight % of the wavelength conversion substances. In addition to such wavelength conversion substances, the light-transmissive member 10 may contain various kinds of filler such as light-diffusing substances.

The light-transmissive member 10 is directly bonded to the light-emitting element 20. In the present disclosure, the phrase "directly bonded" means that interfaces to be bonded (i.e., the upper surface of the light-emitting element 20 and the lower surface of the light-transmissive member 10) are bonded by using bonding of atoms without using a bonding material such as an adhesive. Direct bonding of the light-transmissive member 10 and the light-emitting element 20 enhances heat dissipation of the light-transmissive member 10 to improve reliability of the light-emitting device 1. Particularly, in the case in which the light-transmissive member 10 contains wavelength conversion substances, heat generated by the wavelength conversion substances is effectively dissipated through the light-emitting element 20. Moreover, since the light-transmissive member 10 and the light-emitting element 20 are directly bonded without using other material such as an adhesive, it is possible to increase light-extracting efficiency of the light-emitting device 1.

Light-Emitting Element 20

An example of the light-emitting element 20 include a semiconductor light-emitting element such as a light-emitting diode.

Figure 2A:
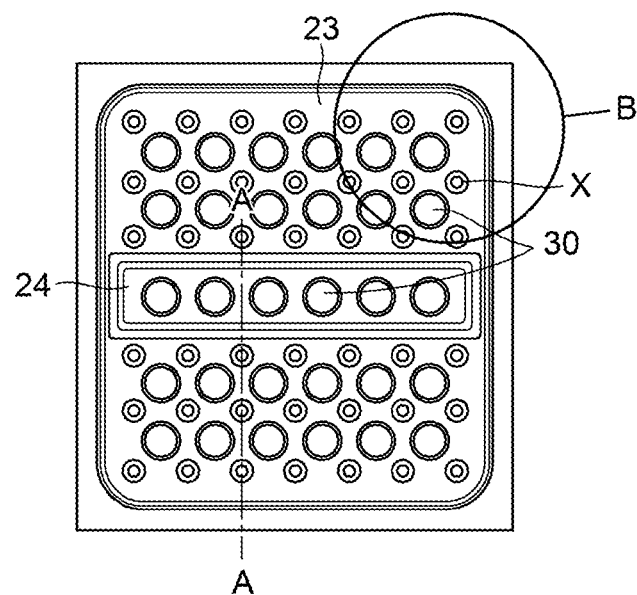
FIG. 2A is a schematic plan view of a light-emitting element 20 on which stud bumps 30 are disposed.
Figure 2B:
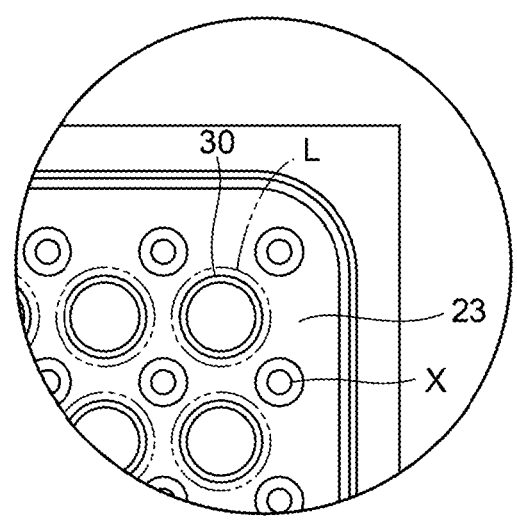
FIG. 2B is a schematic partial enlarged view of FIG. 2A.
Figure 2C:
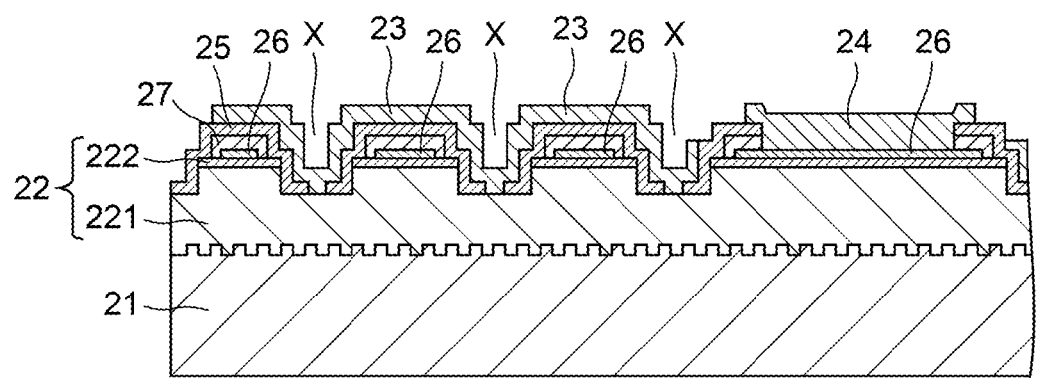
FIG. 2C is a schematic sectional view taken along line A-A in FIG. 2A.

FIG. 2A is a schematic plan view of the light-emitting element 20 on which the stud bumps 30 are disposed. FIG. 2B is a partial enlarged view of FIG. 2A. FIG. 2C is a schematic sectional view taken along line A-A in FIG. 2A. As illustrated in FIG. 2A to FIG. 2C, the light-emitting element 20 includes: a support substrate 21 directly bonded to the light-transmissive member 10; a semiconductor structure 22 formed on the support substrate 21; first electrodes 23; and a second electrode 24. Specifically, the surface of the support substrate 21 opposite to the surface on which the semiconductor structure 22 is formed serves as the upper surface of the light-emitting element 20, and this upper surface is directly bonded to the light-transmissive member 10.

Support Substrate 21

The support substrate 21 may be formed using, for example, a material that allows epitaxial growth of the semiconductor structure 22 so as to serve as a growth substrate of the semiconductor structure 22. Examples of this material include sapphire, spinel, and other insulative substrates.

Semiconductor Structure 22

Various semiconductor materials such as Group III-V compound semiconductors and Group II-VI compound semiconductors may be used for the semiconductor structure 22. Specifically, nitride-based semiconductor materials represented by $In_xAl_yGa_{1-X-Y}N$ ($0 \leq X$, $0 \leq Y$, $X+Y \leq 1$), such as InN, AlN, GaN, InGaN, AlGaN, and InGaAlN may be used. The semiconductor structure 22 includes a first semiconductor layer 221 (e.g., an n-type semiconductor layer), an active layer, and a second semiconductor layer 222 (e.g., a p-type semiconductor layer) in sequence from the support substrate 21. Each of these layers may have a thickness and a layer structure known in the art.

The semiconductor structure 22 includes a plurality of exposed portions X where the first semiconductor layer 221 is not covered by the second semiconductor layer 222 on an upper side of the second semiconductor layer 222. Specifically, the exposed portions X are regions where the second semiconductor layer 222 and the active layer are entirely removed on the second semiconductor layer 222 of the semiconductor structure 22 in the thickness direction in order to expose the surface of the first semiconductor layer 221 from the second semiconductor layer 222 and the active layer. In other words, the semiconductor structure 22 has holes in the surface of the second semiconductor layer 222. Each of the holes has a bottom where the first semiconductor layer 221 is exposed, and has lateral walls where the second semiconductor layer 222, the active layer, and the first semiconductor layer 221 are exposed. The first semiconductor layer 221 exposed on the exposed portions X is electrically connected to the first electrodes 23 (described later). The first electrodes 23 connected to the first semiconductor layer 221 is formed on an insulating film 25 (described later) above the second semiconductor layer 222.

The shapes, sizes, positions, and number of the exposed portions X may be set suitably in accordance with the size, shape, electrode pattern, and other factors of the light-emitting element 20 to be produced.

All of the plurality of exposed portions X may have the same shape and size, and each or some of the exposed portions X may have different shapes and sizes. Preferably, all of the exposed portions X have substantially the same size and shape. The exposed portions X are regions with no active layer, therefore, the plurality of exposed portions X having substantially the same size are regularly arrayed in alignment to reduce localization in light-emitting area and current supply. This can mitigate luminance irregularity of the light-emitting element 20 as a whole.

Examples of the shapes of the individual exposed portions X include circles, ellipses, and polygons such as triangles, rectangles, and hexagons in a plan view. Among these shapes, circles and shapes close to circles (e.g., ellipses and polygons with six and more sides and angles) are preferable.

The sizes of the exposed portions X may be adjusted suitably in accordance with factors such as the plane area of the semiconductor structure 22 and the required light output or luminance of the light-emitting element. For example, in the case in which the shapes of the exposed portions X in a plan view are circles, the diameters may be approximately several tens to several hundred μm.

Preferably, the plurality of exposed portions X are formed inside of an outer edge of the semiconductor structure 22. Also preferably, the exposed portions X are regularly arrayed. For example, preferably, the exposed portions X are separate from each other in a plan view. More preferably, the exposed portions X are aligned at regular intervals. This can mitigate luminance non-uniformity of the light-emitting element 20 to ensure uniform light extraction.

Insulating Film 25

The light-emitting element 20 includes the insulating film 25, which covers the semiconductor structure 22 and has openings above the plurality of exposed portions X. Specifically, the insulating film 25 covers the upper surface and lateral surfaces of the semiconductor structure 22 and has the openings above the exposed portions X. With the insulating film 25 covering the upper surface and lateral surfaces of the semiconductor structure 22 and having the openings above the exposed portions X, the first electrodes 23 are formed over a wide range of an upper surface of the insulating film 25.

The insulating film 25 is formed using a material known in the art to have a thickness securing electric insulation. Specifically, metallic oxides and metallic nitrides may be used for the insulating film 25. For example, at least one kind of oxide or nitride selected from the group consisting of Si, Ti, Zr, Nb, Ta, and Al may be suitably used.

First Electrode 23 and Second Electrode 24

The light-emitting element 20 includes the first electrodes 23, which are electrically connected to the first semiconductor layer 221, and the second electrode 24, which are electrically connected to the second semiconductor layer 222, both disposed on the semiconductor layer 22. The first electrodes 23 and the second electrode 24 are disposed at the upper surface side of the semiconductor structure 22, that is, at the second semiconductor layer 222 side opposite to the support substrate 21. The first electrodes 23 and the second electrode 24 may respectively be not in direct contact with, but electrically connected to, the first semiconductor layer 221 and the second semiconductor layer 222 via a light-reflective electrode 26, described below.

The first electrodes 23 and the second electrode 24 may be formed of single-layer film or multilayer film of metals such as Au, Pt, Pd, Rh, Ni, W, Mo, Cr, Ti, Al, and Cu or alloys of these metals. Specifically, these electrodes may be formed of multilayer film such as Ti/Rh/Au, Ti/Pt/Au, W/Pt/Au, Rh/Pt/Au, Ni/Pt/Au, Al-Cu alloy/Ti/Pt/Au, Al—Si—Cu alloy/Ti/Pt/Au, and Ti/Rh in sequence from the semiconductor structure 22. The thickness may be set at any value used in the art.

In the case in which the semiconductor structure 22 has a rectangular or substantially rectangular shape in a plan view, preferably, the first electrodes 23 and the second electrode 24 similarly have rectangular or substantially rectangular shapes in a plan view. Preferably, within the single semiconductor structure 22, a group of the first electrodes 23 and a group of the second electrode 24 each arranged in one direction are alternately arranged, as viewed from above. In an exemplary arrangement, the second electrode 24 is interposed between the first electrodes 23 in a plan view.

The first electrodes 23 are electrically connected to the exposed portions X at the second semiconductor layer 222 of the semiconductor structure 22 described above. In this case, preferably, the first electrodes 23 are connected so as to cover a plurality of exposed portions X. More preferably, the first electrodes 23 are integrally connected to all of the exposed portions X. Consequently, the first electrodes 23 are located not only on the first semiconductor layer 221 but also above the second semiconductor layer 222. In this case, with the insulating film 25, the first electrodes 23 are disposed over lateral walls of the holes that define the exposed portions X (i.e., the lateral surfaces of the active layer and the second semiconductor layer 222) and above the second semiconductor layer 222. The second semiconductor layer 222 and the first electrodes 23 overlap in a plan view, but are insulated from each other by the insulating film 25.

The second electrode 24 is disposed above the second semiconductor layer 222 of the semiconductor structure 22, and is electrically connected to the second semiconductor layer 222. The second electrode 24 may be in direct contact with the second semiconductor layer 222 or may be located above the second semiconductor layer 222 with the light-reflective electrode 26 described below.

Light-Reflective Electrode 26

The light-emitting element 20 includes the light-reflective electrodes 26, one of which is interposed between the second electrode 24 and the second semiconductor layer 222. Silver, aluminum, and alloys that contain one of these metals as a main component may be used for the light-reflective electrodes 26. In particular, silver and silver alloys are preferable due to their high light reflectance with respect to light emitted from the active layer. Preferably, the light-reflective electrodes 26 have a thickness such that the light-reflective electrodes 26 are capable of effectively reflecting light emitted from the active layer. For example, preferably, the light-reflective electrodes 26 have a thickness of approximately 20 nm to 1 μm. The larger areas of contact surface between the light-reflective electrodes 26 and the second semiconductor layer 222 are, the more preferable. In view of this, preferably, the light-reflective electrodes 26 are also interposed between the first electrodes 23 and the second semiconductor layer 222. Specifically, an overall plane area of the light-reflective electrodes 26 is, for example, 50% or more, 60% or more, and 70% or more of a plane area of the semiconductor structure 22.

In the case of the light-reflective electrodes 26 containing silver, protection layers 27 may be provided to cover upper surfaces of the light-reflective electrodes 26, preferably, the upper surfaces and lateral surfaces of the light-reflective electrodes 26 to prevent or mitigate migration of silver. The protection layers 27 may be made of a conductive member such as a metal or an alloy typically used for an electrode material, or may be made of an insulating member. Examples of the conductive member include a single layer and a multiple layer containing aluminum, copper, nickel, and other metals. Examples of the insulating member include similar materials to the above-described materials for the insulating film 25. In particular, SiN is preferable. A film of SiN has high density, therefore, SiN has an advantage of preventing or mitigating of intrusion of moisture. The thicknesses of the protection layers 27 are, for example, approximately several hundred nm to several μm to effectively prevent or mitigate migration of silver.

In the case of using the insulating member to form the protection layers 27, the protection layers 27 have an opening above the light-reflective electrode 26 so as to allow the light-reflective electrode 26 to electrically connect to the second electrode 24.

In the case in which the light-emitting element 20 includes the light-reflective electrodes 26 and the protection layers 27 on the second semiconductor layer 222, the insulating film 25 covering the semiconductor structure 22 covers the light-reflective electrodes 26 and the protection layers 27, and has an opening in a region immediately under the second electrode 24 so as to electrically connect the second electrode 24 to the light-reflective electrode 26.

Stud Bump 30

The light-emitting element 20 includes the stud bumps 30 connected to the first electrodes 23 and the second electrode 24. A plurality of stud bumps 30 may be disposed on each of the first electrodes 23 and the second electrode 24. The stud bumps 30 are disposed on the first electrodes 23 and the second electrode 24 of the light-emitting element 20 with high density to increase paths in which heat generated by light emission of the light-emitting element 20 is dissipated from the mounting base 70 through the stud bumps 30. The stud bumps 30 may be formed using, for example, gold, silver, copper, tin, platinum, zinc, nickel, or alloys of these metals.

As illustrated in FIG. 2A and FIG. 2B, the stud bumps 30 are provided so as not to overlap the exposed portions X of the first semiconductor layer 221 in the light-emitting element 20 in a plan view. This arrangement of the stud bumps 30 separated from the exposed portions X can prevent or mitigate a crack generated in the light-emitting element 20 caused by pressure exerted on the light-emitting element 20 at the time of formation of the stud bumps 30 and flip-chip mounting of the light-emitting element 20.

Specifically, as illustrated in FIG. 2A to FIG. 2C, the first electrodes 23 of the light-emitting element 20 are formed on the insulating film 25 above the second semiconductor layer 222. The insulating film 25 covers the semiconductor structure 22 and has the openings above the exposed portions X. The first electrodes 23 are electrically connected to the first semiconductor layer 221 at the bottoms of the openings. The first electrodes 23 are formed on the insulating film 25 that directly or indirectly covers the semiconductor structure 22 so as to cover lateral surfaces of the exposed portions X (i.e., the lateral walls of the holes that define the exposed portions X) and the upper surface of the second semiconductor layer 222. The semiconductor structure 22 has stair-step(s) between the exposed portions X and the surface of the second semiconductor layer 222, hence a crack may be generated by a large load applied to the stair-step. In particular, a metallic oxide or a metallic nitride for forming the insulating film 25 is stiffer and more brittle than metal materials for forming the first electrodes 23 and the second electrode 24, a crack is more likely to be generated. A crack generated in the insulating film 25 may unfortunately cause the first electrodes 23 to be electrically connected to the second semiconductor layer 222 resulting in a short circuit in the light-emitting element 20. In an arrangement where the exposed portions X and the stud bumps 30 overlap each other in a plan view, that is, in the case in which the stud bumps 30 are disposed right above the exposed portions X in a sectional view, a large load may be applied on the above-described differences caused by the mechanical stress at the time of flip-chip mounting. This may disadvantageously make a crack in the insulating film 25 that covers the semiconductor structure 22. However, arrangement of the stud bumps 30 and the exposed portions X being disposed to be separated from each other in a plan view enables alleviation of a large load exerted on the stair-steps, thereby preventing or discouraging generation of a crack in the insulating film 25. "Being separated" or "separated" in the present disclosure refers to an outer edge of each stud bump 30 not overlapping an outer edge of each exposed portion X in a plan view even after the stud bump 30 spreads laterally and increase in surface area due to pressure at the time of flip-chip mounting of the light-emitting element 20. A double chain line L in FIG. 2B indicates a shape of the stud bump 30 after squashed. As illustrated in FIG. 2B, "being separated" or "separated" in the present disclosure refers to the outer edge of the stud bump 30 not overlapping the outer edge of the exposed portion X in a plan view even after the stud bump 30 is squashed.

Figure 3:
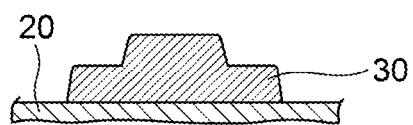
FIG. 3 is a schematic sectional view of the stud bump 30.

FIG. 3 is a schematic sectional view of the stud bump 30. As illustrated in FIG. 3, the stud bump 30 has a center tip that protrudes toward opposite side from the first electrodes 23 and the second electrode 24 of the light-emitting element 20, in a sectional view. The stud bump 30 having this shape may be formed by, for example, a stud bump bonder and a wire bonding device.

Mounting Base 70

The light-emitting elements 20 are mounted above the mounting base 70 with the stud bumps 30 by flip-chip technology. The thickness of the mounting base 70 is, for example, approximately 0.2 mm to 5 mm. An exemplary plane shape of the mounting base 70 includes a circle, an ellipse, a polygon such as a rectangle, and another shape resembling these shapes. Preferably, the mounting base is in a form of a plate or sheet.

The mounting base 70 may be formed using a material selected from composite materials of, for example, resin (including fiber-reinforced resin), ceramic, glass, metal, and paper. Among these materials, ceramic is preferable due to its heat resistance and weather resistance. Examples of the ceramic include aluminum oxide, aluminum nitride, zirconium oxide, zirconium nitride, titanium oxide, titanium nitride, and mixtures of these ceramic materials.

The mounting base 70 has the wirings 80 disposed at least on the upper surface thereof. The light-emitting elements 20 are mounted above the wirings 80 by flip-chip technique. For the wirings 80, any wiring may be employed insofar as the wirings are capable of supplying current to the light-emitting elements 20. The wirings 80 may be formed using a material and have a thickness and a shape that are usually used in the art. Specifically, examples of the material include metals such as copper, iron, nickel, chromium, aluminum, gold, silver, platinum, titanium, tungsten, and palladium, and alloys of these metals. In particular, preferably, the wirings 80 formed on the upper surface of the mounting base 70 has an uppermost surface covered with a highly-reflective material such as silver or gold to efficiently extract light from the light-emitting elements 20. The wirings 80 can be formed by methods such as electrolytic plating, electroless plating, vapor deposition, and sputtering. For example, in the case in which gold is used for a material of the stud bumps 30, use of gold for forming the uppermost surface of the wirings 80 can improve bonding strength between the light-emitting elements 20 and the mounting base 70.

The stud bumps 30 on the light-emitting elements 20 are bonded to the wirings 80 by a flip-chip technique, such as ultrasonic bonding. In addition to the wirings 80, the mounting base 70 may include a frame and other components for holding a covering member 60 described later.

Antireflective Film 40

In order to increase transmittance of light from the light-emitting elements 20, the light-emitting device 1 may include a antireflective film 40 on the surface of each light-transmissive member 10, opposite to the surface where the light-emitting element 20 is fixed. The antireflective films 40 are formed on the light-emitting surface of the light-transmissive members 10 to improve emission efficiency of light from the light-emitting elements 20 while reducing transmission of light from outside the light-emitting device 1. For the antireflective films 40, a single-layer or multi-layer film formed using a light-transmissive material such as $SiO_2$ and $ZrO_2$ may be used.

Light Guide Member 50

The light-emitting device 1 may include light guide members 50 covering lateral surfaces of each light-emitting element 20. The light guide members 50 cover the lateral surfaces of the light-emitting element 20 and a lower surface of each light-transmissive member 10 that is exposed from the light-emitting element 20. Such light guide members 50 are provided to cause light emitted from the lateral surfaces of the light-emitting element 20 to be appropriately reflected by outer surfaces of the light guide members 50 so as to guide the reflected light to the light-transmissive member 10.

Preferably, the light guide members 50 are formed using a resin material that is easy to handle and process. An example of the resin material includes a resin containing one or more of a silicone resin, a modified silicone resin, an epoxy resin, a modified epoxy resin, an acryl resin, and a fluorocarbon resin or a hybrid resin of these resins. As described below, the light guide members 50 may be formed utilizing viscosity of the resin material for the light guide members 50 and wettability with respect to the light-emitting elements 20.

Covering Member 60

The light-emitting device 1 may include the covering member 60 covering lateral surfaces of the stud bumps 30. In particular, preferably, the covering member 60 covers all of; the lateral surfaces of the light-emitting elements 20; space between the light-emitting elements 20 and the mounting base 70; the upper surface of the mounting base 70; and the lateral surfaces of the stud bumps 30. Thus, light from the light-emitting elements 20 toward the mounting base 70 is reflected with high efficiency.

The covering member 60 may be formed using, for example, a resin material having such properties as light reflectiveness, light transmissivity, and light-shielding properties. The resin material for the covering member 60 may contain at least one of a light-reflective substance, a diffuser, and a colorant. For the resin material and substances such as the light-reflective substance, any of resin materials and substances usually used in the art may be used. An example of the resin material includes a resin containing one or more of a silicone resin, a modified silicone resin, an epoxy resin, a modified epoxy resin, and an acryl resin or a hybrid resin of these resins. Examples of the light-reflective substances include titanium oxide, silicon oxide, zirconium oxide, yttrium oxide, yttria-stabilized zirconia, potassium titanate, alumina, aluminum nitride, boron nitride, and mullite.

The light-emitting device 1 may include components, for example, electronic parts and semiconductor elements such as a protection element 90. Preferably, these elements and electronic parts are embedded in the covering member 60.

With the light-emitting device 1 according to the first embodiment described above, the light-emitting elements 20 on which the stud bumps 30 are formed are mounted on the mounting base 70 by flip-chip technique, thereby enabling reduction in the mechanical stress on the light-emitting elements 20 at the time of flip-chip mounting. The stud bumps 30 are formed on the light-emitting elements 20, but not on the mounting base 70, thereby facilitating accurate positioning of the light-emitting elements 20 and the stud bumps 30 to each other. In particular, in the case in which the light-emitting elements 20 include the above-described exposed portions X, the stud bumps 30 are easily disposed to be separated from the exposed portions X. This more effectively reduce a possibility of a crack generation in the light-emitting elements 20 described above.

Light-Emitting Device 2 According to Second Embodiment

Figure 4:
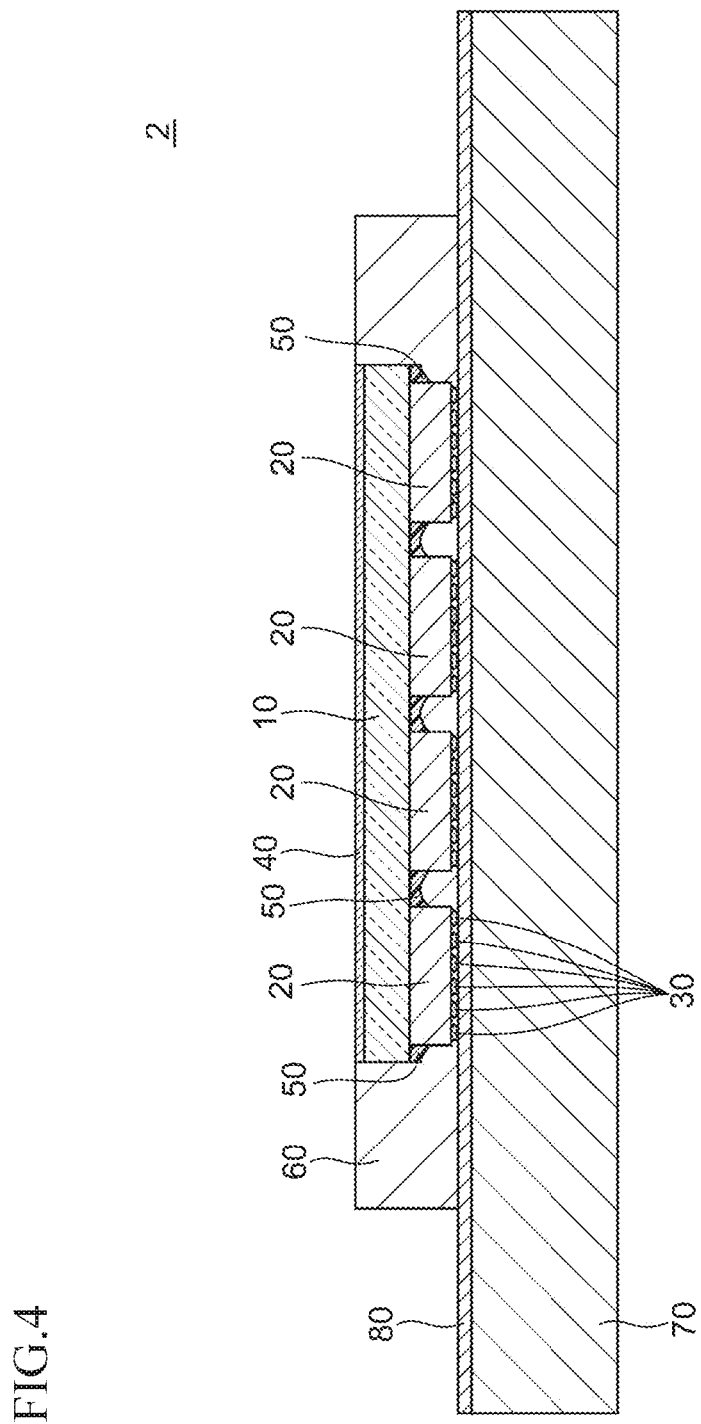
FIG. 4 is a schematic sectional view of a light-emitting device 2 according to a second embodiment.

FIG. 4 is a schematic sectional view of a light-emitting device 2 according to a second embodiment. As illustrated in FIG. 4, the light-emitting device 2 according to the second embodiment is different from the light-emitting device 1 according to the first embodiment in that a plurality of light-emitting elements 20 are directly bonded to a single light-transmissive member 10. In a similar manner to the light-emitting device 2 according to the second embodiment, using the light-emitting device 1 according to the first embodiment can reduce a mechanical stress on the light-emitting elements 20 at the time of flip-chip mounting. The light-emitting elements 20 and the stud bumps 30 are easily accurately positioned to each other. In particular, in the case in which the light-emitting elements 20 include the above-described exposed portions X, it is possible to more effectively mitigate a crack generation in the light-emitting elements 20 described above.

Method of Manufacturing Light-Emitting Device 1 According to First Embodiment

FIG. 5A to FIG. 5I are schematic sectional views illustrating a method of manufacturing the light-emitting device 1 according to the first embodiment. The method of manufacturing the light-emitting device 1 according to the first embodiment includes, in this order: directly bonding a plurality of light-emitting elements 20 to a light-transmissive member 10 having a plate like shape; forming stud bumps on each of a plurality of electrodes on the light-emitting elements 20; obtaining a plurality of light-transmissive member 10 on each of which one or more of the light-emitting elements 20 are bonded, by dividing the light-transmissive member; and mounting the light-emitting elements 20 on or above a mounting base 70 by flip-chip technique.

A description of such a method will next be made step by step.

Providing Light-Transmissive Member

Figure 5A:
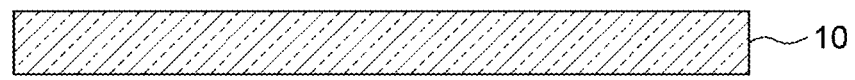
FIG. 5A is a schematic sectional view illustrating a method of manufacturing the light-emitting device 1 according to the first embodiment.

First, as illustrated in FIG. 5A, the light-transmissive member 10 having a plate like shape is provided.

Directly Bonding

Figure 5B:
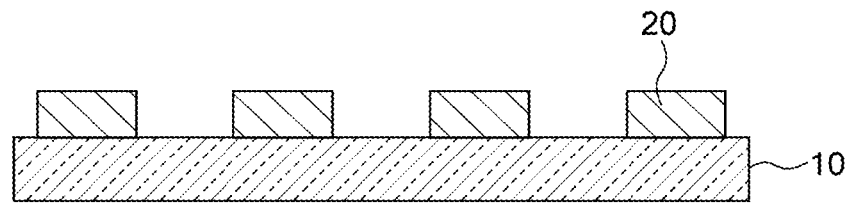
FIG. 5B is a schematic sectional view illustrating the method of manufacturing the light-emitting device 1 according to the first embodiment.

Subsequently, as illustrated in FIG. 5B, the plurality of light-emitting elements 20 are directly bonded to the light-transmissive member 10 having a plate like shape. Specifically, the support substrate 21 of each of the light-emitting elements 20 is directly bonded to the light-transmissive member 10. In this manner, before the plurality of light-emitting elements 20 are directly bonded to the light-transmissive member 10 before being flip-chip mounted. This can improve positioning accuracy of the light-emitting elements 20 with respect to the upper surface of the light-transmissive member 10 (i.e., the light-emitting surface of the light-emitting device 1) in comparison with the case in which an individual light-transmissive member 10 is adhered to each of the plurality of light-emitting elements 20 that have been flip-chip mounted.

As a direct bonding method, methods known in the art may be adopted. For example, any of surface-activated bonding, hydroxyl group bonding, and atomic diffusion bonding may be adopted. Employing any of surface-activated bonding, hydroxyl group bonding, and atomic diffusion bonding can realize integral bonding of the light-emitting elements 20 and the light-transmissive member 10 in an environment close to normal temperature.

Surface-activated bonding is a method of bonding by processing surfaces to-be bonded in a vacuum to make them chemically bonded to each other easily. Hydroxyl group bonding is a method in which hydroxyl groups are formed on surfaces to-be bonded by, for example, atomic layer deposition, and the hydroxyl groups on the surfaces are bonded to each other. Atomic diffusion bonding is a method in which a metal film having a thickness equivalent to a single atomic layer is formed on each of surfaces to-be bonded, and the surfaces are brought into contact to each other in a vacuum or inert gas atmosphere, to bond metal atoms to each other.

In order to effectively perform bonding at normal temperature, preferably, the bonding surface of the light-transmissive member 10 and the bonding surfaces of the light-emitting elements 20 have high flatness. Specifically, an arithmetic average roughness Ra of the bonding surfaces is preferably equal to or less than 1.0 nm, more preferably, equal to or less than 0.3 nm. As a method of processing the bonding surfaces to have such a roughness, mechanical polishing, chemical polishing, and other known methods may be adopted.

Forming Antireflective Film

Figure 5C:
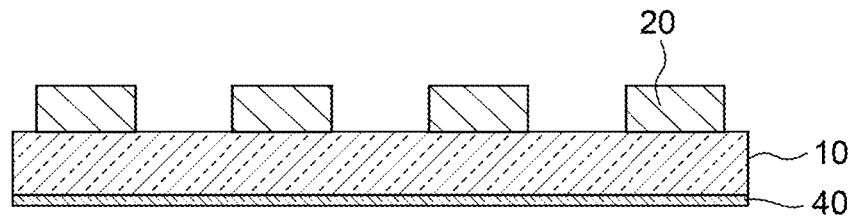
FIG. 5C is a schematic sectional view illustrating the method of manufacturing the light-emitting device 1 according to the first embodiment.

After bonding directly and before forming the stud bumps, the method of manufacturing the light-emitting device 1 may include forming the antireflective film 40 on the surface of the light-transmissive member 10, opposite to the surface on which the light-emitting elements 20 are bonded. In forming the antireflective film, as illustrated in FIG. 5C, the antireflective film 40 is formed on the surface serving as the light-emitting surface of the light-emitting device 1. The surface serving as the light-emitting surface of the light-emitting device 1 is the surface of the light-transmissive member 10 opposite to the surface on which the light-emitting elements 20 are bonded. As described above, before performing directly bonding of the light-transmissive member 10 and the light-emitting elements 20, pretreatment for processing the bonding surfaces, such as polishing, is necessary. In polishing, a variance may occur in the thickness of the light-transmissive member 10. This thickness deviation can be fixed by processing, for example, polishing the surface of the light-transmissive member 10 opposite to the surface on which the light-emitting elements 20 are bonded. That is, the antireflective film 40 is formed after directly bonding the light-transmissive member 10 and the light-emitting elements 20 so as to perform polishing to address the above-described thickness variance as pretreatment of forming the antireflective film.

Forming Stud Bumps

Figure 5D:
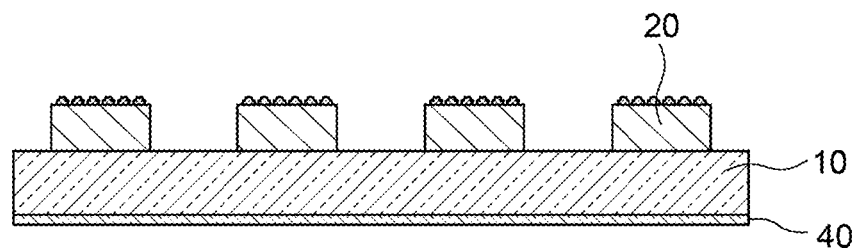
FIG. 5D is a schematic sectional view illustrating the method of manufacturing the light-emitting device 1 according to the first embodiment.

Subsequently, as illustrated in FIG. 5D, the stud bumps 30 are formed on each of the light-emitting elements 20. The stud bumps 30 may be formed, for example, by a stud bump bonder or wire bonder on the market. Specifically, a tip of metal wire introduced from a capillary of the stud bump bonder is fused into a ball. Balls thus formed are secured to the first electrodes 23 and the second electrode 24 of the light-emitting element 20 by a method such as ultrasonic thermocompression bonding, and the secured balls are separated from the metal wire. In this manner, each stud bump 30 is formed on the first electrodes 23 and the second electrode 24 of the light-emitting element 20. Each ball is separated preferably as follows: after the ball is secured to the first electrodes 23 or the second electrode 24, the capillary is moved upwardly while the metal wire is held, and then, the capillary is moved horizontally to separated the deformed ball by scratching with an edge on the distal end of the capillary in such a manner as to make an upper end of the metal wire relatively flat.

The shape of the formed stud bump 30 may be adjusted suitably by an amount of fused metal wire, a shape of the distal end of the capillary, a magnitude of compression, and other factors. The height of the stud bump 30 may be adjusted suitably by, for example, a height of upward movement and a timing of horizontal movement of the capillary. The upper end of the stud bump 30 may be subjected to flattening processing, such as etching, blasting, and polishing. Alternatively, a voltage may be applied to the formed stud bump 30 to generate spark to fuse and recrystallize to soften or flatten the upper end of the stud bump 30.

By adopting this method, the stud bump 30 having a center tip protrusion is formed on the light-emitting element 20. The softened upper end of the stud bump 30 can facilitate deformation of the upper end to be adhered to the wirings 80 on the mounting base 70 at the time of flip-chip mounting. This ensures bonding with high strength even in room temperature.

The interval between the stud bumps 30 may be set suitably in accordance with a size of the light-emitting element 20, the number of the stud bumps 30 to be formed, and other factors. For example, in view of heat dissipation, the larger the area on which the stud bumps 30 are bonded to the light-emitting element 20 is, the more preferable. Consequently, the shorter the interval between the stud bumps 30 formed on the identical electrode is, the more preferable. In consideration of fluidity of a resin material in forming the covering member described below, the stud bumps 30 are preferably separated from each other with an interval so as not to reduce fluidity of the resin material. In view of these considerations, the interval between the stud bumps 30 is, for example, approximately 10 µm to 45 µm. As described above, the stud bumps 30 are formed on the light-emitting element 20, in this embodiment. Therefore, the light-emitting element 20 and the stud bumps 30 may be positioned relative to each other with high accuracy. This can shorten the interval between the stud bumps 30 while the stud bumps 30 are appropriately separated from one another.

In the case in which bumps are formed by plating instead of the stud bumps 30, it is necessary to change a design of a mask for forming the plated bumps in accordance with a change of an electrode design of the light-emitting element 20. This may have a possibility to disadvantageously increase time, labor, and cost. However, use of the stud bumps 30 ensures positioning of the bumps at desired locations on the light-emitting element 20 without using the mask. In the case in which bumps are formed by plating, light-emitting elements with plated bumps and a light-transmissive member are to be directly bonded after forming the plated bumps. However, in this case, a load caused by directly bonding the light-emitting elements to the light-transmissive member may squash the plated bumps on the light-transmissive member. This may unfortunately result in a possibility to increase height variance of the light-emitting elements. Such a possibility is not to occur according to this embodiment, in which the stud bumps 30 are formed after directly bonding the light-transmissive member 10 and the light-emitting element 20.

In the case in which stud bumps are formed on a mounting base, positioning of the stud bumps formed on the mounting base to electrodes of each light-emitting element. In other words, in order to position the stud bumps at desired positions on the light-emitting element, variance in positional precision in forming the stud bumps on the mounting base, and variance in positional precision in flip-chip mounting of the light-emitting element on the stud bumps are both to be taken into account. This increases a restriction on the size of the stud bumps. However, such a restriction is mitigated according to this embodiment, in which the stud bumps 30 are formed on the light-emitting element 20. Only positional precision in forming the stud bumps 30 on the light-emitting element 20 is needed to be taken into account to set the size of the stud bumps 30. Moreover, stud bumps 30 having a larger plane area may be arranged at positions on the light-emitting element 20, which do not overlap the exposed portions X as described above. This can increase the contact areas between the light-emitting elements 20 and the mounting base 70, thereby improving heat dissipation of the light-emitting device 1. Furthermore, the stud bumps are highly precisely formed at desired positions in accordance with an electrode pattern of the light-emitting element 20, thereby enabling increase, for example, areas of the light-reflective electrodes 26 and/or the number of the exposed portions X in the light-emitting element 20. This also contributes to improvement of light extraction efficiency and improvement of current diffusibility of the light-emitting elements 20.

Forming Light Guide Members

Figure 5E:
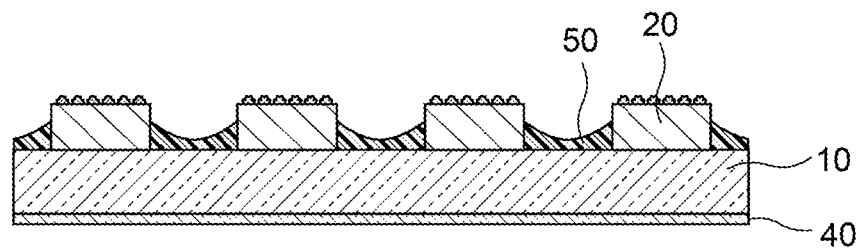
FIG. 5E is a schematic sectional view illustrating the method of manufacturing the light-emitting device 1 according to the first embodiment.

After forming the stud bumps 30 and before obtaining a plurality of light-transmissive members 10, the method of manufacturing the light-emitting device 1 may include forming the light guide members to cover the lateral surfaces of the plurality of light-emitting elements 20 with the light guide members 50. In forming the light guide members, as illustrated in FIG. 5E, the light guide members 50 are formed to cover the lateral surfaces of the plurality of light-emitting elements 20. Preferably, a resin material that is easy to handle and process is used for the light guide members 50. In the case of the light guide members 50 formed using a resin material, arranging a light-transmissive member before forming stud bumps may have a possibility to deteriorate the light-transmissive member by heat generated at the time of forming the stud bumps. However, such a possibility may be mitigated in this step at which after forming the stud bumps 30 and before obtaining a plurality of light-transmissive members 10, the lateral surfaces of the plurality of light-emitting elements 20 are covered with the light guide members 50.

Dividing

Figure 5F:
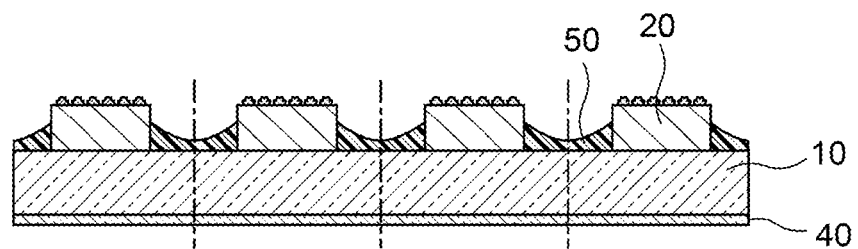
FIG. 5F is a schematic sectional view illustrating the method of manufacturing the light-emitting device 1 according to the first embodiment.

Subsequently, as illustrated in FIG. 5F, the light-transmissive member 10 including the light guide members 50 and the light-emitting elements 20 with the stud bumps 30 is divided in the an optional position, for example, in dotted lines in FIG. 5F per each of the light-emitting elements 20. Thus, light-transmissive members 10 each including the single light-emitting element 20 are obtained. Division may be performed by a dicing saw or other techniques known in the art.

Flip-Chip Mounting

Figure 5H:
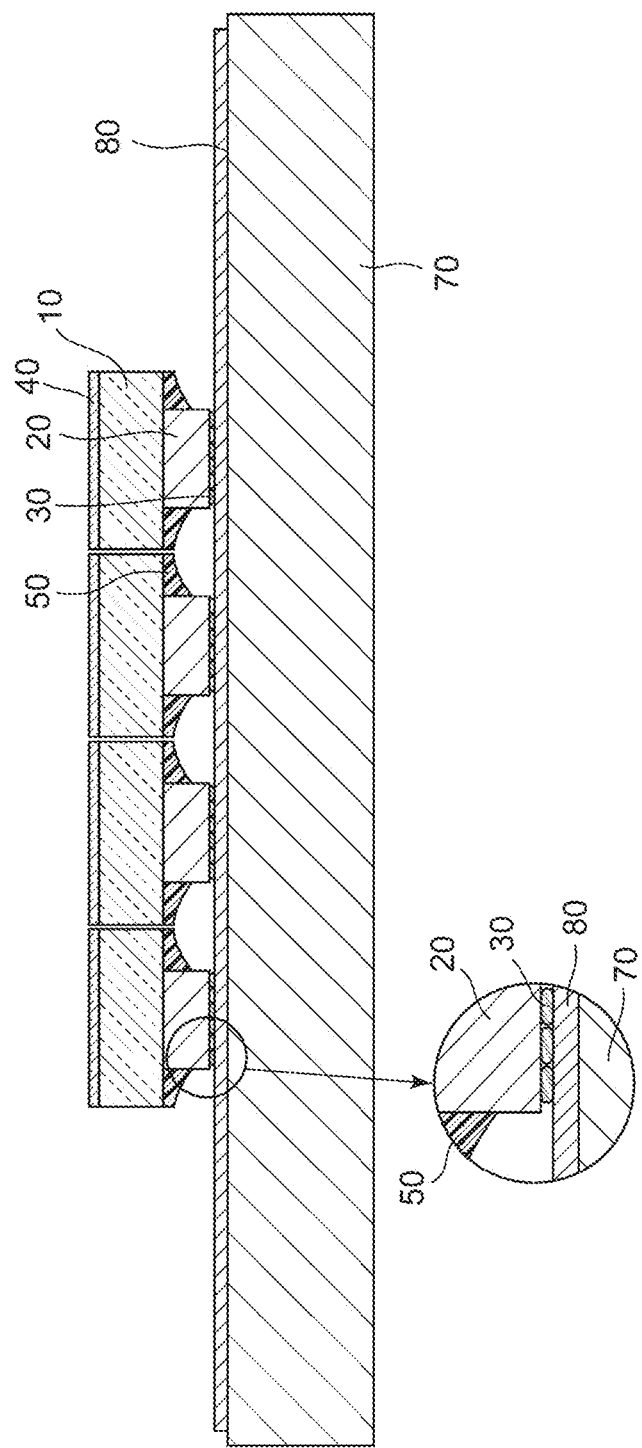
FIG. 5H is a schematic sectional view illustrating the method of manufacturing the light-emitting device 1 according to the first embodiment.

Subsequently, as illustrated in FIG. 5G and FIG. 5H, each of the light-emitting elements 20 is mounted on or above the mounting base 70 by flip-chip technique. FIG. 5G shows a state before flip-chip mounting. FIG. 5H shows a state after flip-chip mounting. As described above, the stud bumps 30 have center tips that protrude toward opposite side from the surface bonded to the light-emitting element 20. The light-emitting element 20 is flip-chip mounted with these center tip protrusions facing the mounting base 70. The center tip protrusions are portioned at areas where stress generated by bonding is likely to concentrate, whereby mounting with the center tips facing the mounting base 70 can mitigate stress on the light-emitting element 20. Particularly the light-emitting element 20 is integrally bonded to the light-transmissive member 10 by direct bonding, an impact at the time of flip-chip mounting can be released to the light-transmissive member 10 integrated with the light-emitting element 20. This reduces stress on the light-emitting element 20.

As illustrated in FIG. 5H, after flip-chip mounting, the stud bumps 30 have squashed shapes. In this regard, as described above, the double chain lines L in FIG. 2B indicate the squashed shapes of the stud bumps 30. As illustrated in FIG. 2B, the stud bumps 30 are separated from the exposed portions X in a plan view even after squashed.

An example of a flip-chip mounting technique is ultrasonic bonding.

Forming Covering member

Figure 5I:
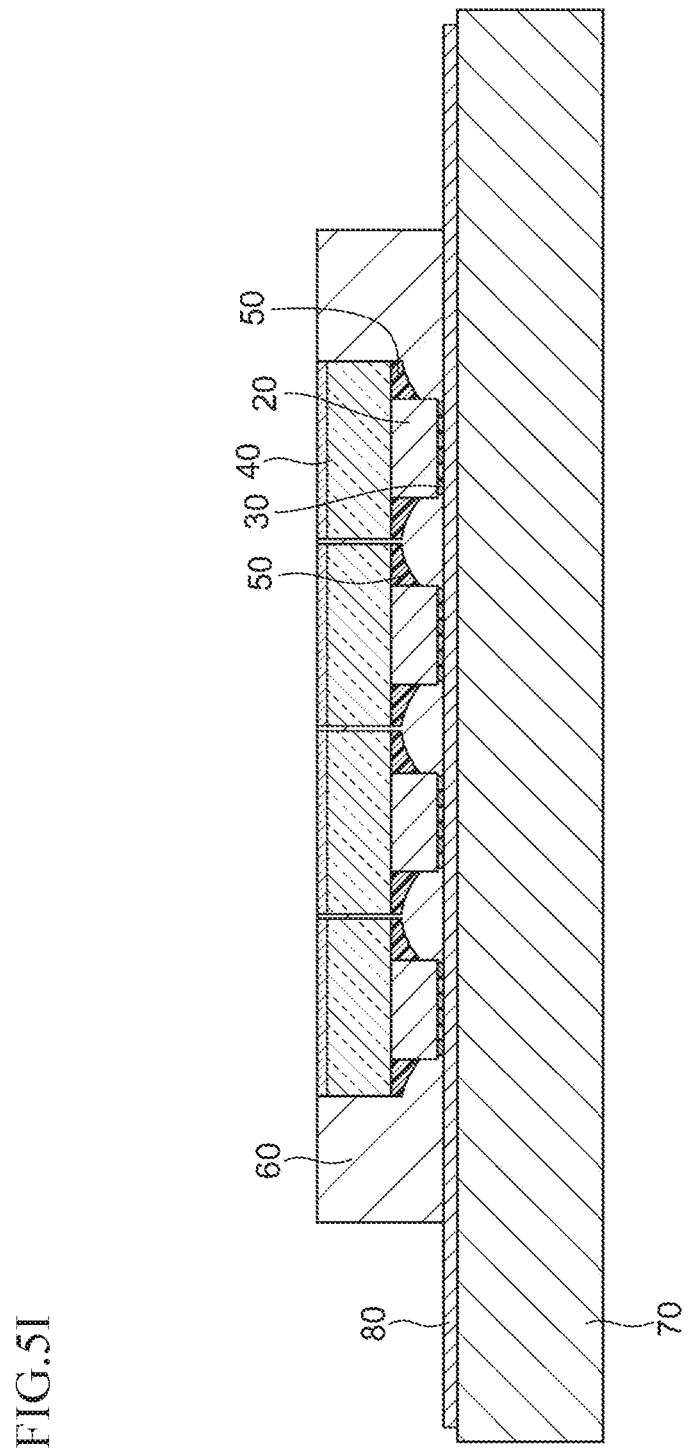
FIG. 5I is a schematic sectional view illustrating the method of manufacturing the light-emitting device 1 according to the first embodiment.

After flip-chip mounting, the method of manufacturing the light-emitting device 1 may include forming the covering member 60 which covers the lateral surfaces of the stud bumps 30. In forming the covering member, as illustrated in FIG. 5I, the covering member 60 is formed to cover the lateral surfaces of the stud bumps 30. The covering member 60 is formed to cover the lateral surfaces of the stud bumps 30 under the light-emitting elements 20 (i.e., between the light-emitting elements 20 and the mounting base 70). The covering member 60 is formed to further cover lateral surfaces of the light-transmissive members 10 and lateral surfaces of the light-emitting elements 20 and the light guide members 50. At this time, upper surfaces of the light-transmissive members 10 (i.e., the surfaces where the anti-reflective films 40 are formed) are exposed from the covering member 60 to form the light-emitting device 1 that has the upper surfaces of the light-transmissive members 10 serving as light-emitting surfaces.

A material used for forming the covering member 60 should easily fill a gap between the light-emitting elements 20 and the mounting base 70, and to mitigate generation of voids. From this point of view, the material of the covering member 60 preferably contains a resin material that has high fluidity and cures when irradiated with heat or light. An example of the material includes a material with fluidity that has a viscosity of 0.5 Pa·s to 30 Pa·s. A reflection amount and a transmission amount of light may be changed in accordance with, for example, the content of a light-reflective substance in the material used for forming the covering member 60. The covering member 60 preferably contains, for example, 20 wt % or more of a light-reflective substance. The covering member 60 may be molded by methods known in the art, such as injection molding, potting molding, resin printing, transfer molding, and compression molding.

In the method of manufacturing the light-emitting device 1 according to the first embodiment described above, the center tip protrusions of the stud bumps 30 are squashed by the mounting base 70 and the wirings 80, but not by the light-emitting elements 20. This can reduce a mechanical stress on the light-emitting elements 20 at the time of flip-chip mounting of the light-emitting elements on or above the mounting base.

The method of manufacturing the light-emitting device 2 according to the second embodiment includes substantially the same steps as the method of manufacturing the light-emitting device 1 according to the first embodiment except for the above-described dividing step of dividing the light-transmissive member 10 to obtain a plurality of light-transmissive members 10 to each of which two or more light-emitting elements 20 are bonded. Therefore, description on the method of manufacturing the light-emitting device 2 will be omitted.

Although certain embodiments have been described above, the invention is not limited to the described embodiments.

What is claimed is:

1. A light-emitting device comprising:
a mounting base;
a plurality of light-emitting elements mounted on or above the mounting base;
a plurality of light-transmissive members respectively disposed on upper surfaces of the plurality of light-emitting elements;
a plurality of light guide members respectively covering lateral surfaces of the plurality of light-emitting elements;
a plurality of antireflective films respectively disposed on upper surfaces of the plurality of the light-transmissive members; and
a covering member covering lateral surfaces of the plurality of antireflective films.

2. The light-emitting device according to claim 1, further comprising:
wirings formed on an upper surface of the mounting base,
wherein the plurality of light-emitting elements are bonded to the wirings with stud bumps.

3. The light-emitting device according to claim 1, further comprising:
wirings formed on an upper surface of the mounting base,
wherein the plurality of light-emitting elements are bonded to the wirings with stud bumps,
wherein intervals between the stud bumps are 10 µm to 45 µm.

4. The light-emitting device according to claim 1,
wherein intervals between the plurality of antireflective films are smaller than intervals between the plurality of light-emitting elements.

5. The light-emitting device according to claim 1,
wherein lateral surfaces of the plurality of light-transmissive members and lateral surfaces of the plurality of antireflective films are flush with each other.

6. The light-emitting device according to claim 1,
wherein the plurality of light-transmissive members have lateral surfaces perpendicular to an upper surface of the mounting base,
wherein the plurality of antireflective films have lateral surfaces perpendicular to an upper surface of the mounting base,
wherein the lateral surfaces of the plurality of light-transmissive members and the lateral surfaces of the plurality of antireflective films are flush with each other.

7. The light-emitting device according to claim 1,
wherein lateral surfaces of the plurality of light-transmissive members, lateral surfaces of the plurality of light guide members and lateral surfaces of the plurality of antireflective films are flush with each other.

8. The light-emitting device according to claim 1,
wherein the plurality of light-transmissive members have lateral surfaces perpendicular to an upper surface of the mounting base,
wherein the plurality of light guide members have lateral surfaces perpendicular to an upper surface of the mounting base,
wherein the plurality of antireflective films have lateral surfaces perpendicular to an upper surface of the mounting base,
wherein the lateral surfaces of the plurality of light-transmissive members, the lateral surfaces of the plurality of light guide members and the lateral surfaces of the plurality of antireflective films are flush with each other.

9. The light-emitting device according to claim 1,
wherein upper surfaces of the plurality of antireflective films and an upper surface of the covering member are flush with each other.

10. The light-emitting device according to claim 1,
wherein the covering member covers space between the light-emitting elements.

* * * * *